United States Patent
Tryon et al.

(10) Patent No.: US 8,968,528 B2
(45) Date of Patent: Mar. 3, 2015

(54) PLATINUM-MODIFIED CATHODIC ARC COATING

(75) Inventors: Brian S. Tryon, Glastonbury, CT (US); Michael J. Maloney, Marlborough, CT (US); David A. Litton, Rocky Hill, CT (US)

(73) Assignee: United Technologies Corporation, Hartford, CT (US)

( * ) Notice: Subject to any disclaimer, the term of this patent is extended or adjusted under 35 U.S.C. 154(b) by 1174 days.

(21) Appl. No.: 12/102,311

(22) Filed: Apr. 14, 2008

(65) Prior Publication Data

US 2009/0258165 A1    Oct. 15, 2009

(51) Int. Cl.
C23C 14/34 (2006.01)
C23C 14/16 (2006.01)
C23C 14/32 (2006.01)

(52) U.S. Cl.
CPC ............ C23C 14/16 (2013.01); C23C 14/3407 (2013.01); C23C 14/325 (2013.01)
USPC ............ 204/192.38; 204/298.13; 204/298.12; 204/298.41; 204/192.15

(58) Field of Classification Search
CPC ................ C23C 14/3407; C23C 14/3414
USPC ............. 204/192.12, 192.38, 298.12, 298.13, 204/298.41, 192.15
See application file for complete search history.

(56) References Cited

U.S. PATENT DOCUMENTS

| | | | |
|---|---|---|---|
| 3,528,387 A * | 9/1970 | Hamilton | 118/723 VE |
| 3,836,451 A * | 9/1974 | Snaper | 204/298.41 |
| 4,029,545 A * | 6/1977 | Gordon et al. | 376/417 |
| 4,090,941 A * | 5/1978 | Wright et al. | 204/298.06 |
| 4,346,137 A * | 8/1982 | Hecht | 428/215 |
| 4,477,538 A | 10/1984 | Clarke | |
| 4,839,011 A * | 6/1989 | Ramalingam et al. | 204/192.38 |
| 4,885,134 A | 12/1989 | Hatwar | |
| 4,929,322 A * | 5/1990 | Sue et al. | 204/192.38 |
| 5,282,946 A * | 2/1994 | Kinoshita et al. | 204/298.13 |
| 5,932,078 A * | 8/1999 | Beers et al. | 204/298.41 |
| 6,030,514 A * | 2/2000 | Dunlop et al. | 204/298.12 |
| 6,080,246 A * | 6/2000 | Wing | 148/512 |
| 6,641,647 B2 * | 11/2003 | Uemura et al. | 96/11 |
| 6,797,137 B2 * | 9/2004 | Sandlin et al. | 204/298.13 |
| 8,241,468 B2 * | 8/2012 | Beers et al. | 204/192.38 |
| 2005/0123783 A1 | 6/2005 | Gregory et al. | |
| 2006/0093849 A1 * | 5/2006 | Farmer et al. | 428/651 |
| 2007/0138019 A1 | 6/2007 | Kasule | |

FOREIGN PATENT DOCUMENTS

| | | |
|---|---|---|
| EP | 0587341 A1 | 3/1994 |
| EP | 0992606 A2 | 4/2000 |
| EP | 1801263 A1 | 6/2007 |
| EP | 2093307 A1 | 8/2009 |
| JP | 61169166 A * | 7/1986 |

OTHER PUBLICATIONS

Derwent Publication 1986-241393 to Fukui JP 61-169166 published Jul. 1986.*

* cited by examiner

Primary Examiner — John Brayton
(74) Attorney, Agent, or Firm — Bachman & LaPointe, P.C.

(57) ABSTRACT

A process for coating a part comprises the steps of providing a chamber which is electrically connected as an anode, placing the part to be coated in the chamber, providing a cathode formed from a coating material to be deposited and platinum, and applying a current to the anode and the cathode to deposit the coating material and the platinum on the part.

8 Claims, 1 Drawing Sheet

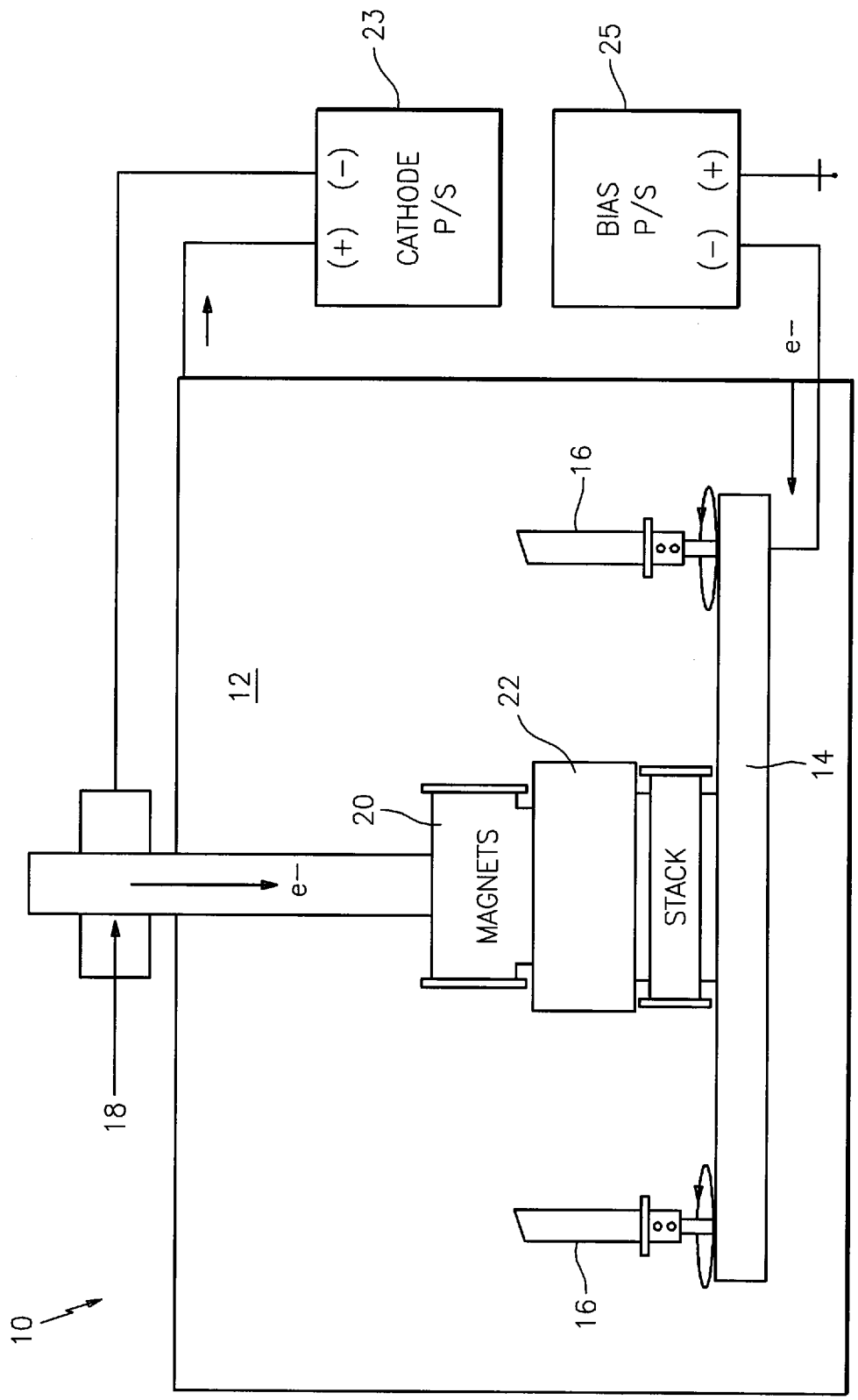

PLATINUM-MODIFIED CATHODIC ARC COATING

BACKGROUND

The present disclosure relates to a process and an apparatus for forming a platinum modified cathodic arc coating on a part, such as a turbine engine component.

The high temperature exposure of nickel-based superalloys in turbine engines continues to increase. Thus, alloys must continually be adapted to this high temperature combustion environment. Advanced thermal barrier coating systems (TBCs) provide a means to shelter the structural element, i.e turbine blade or vane, from the highest temperatures in the engine; however, oxidation of the metal surface below still takes place as the thermal barrier coating is oxygen transparent. Metallic bond coats are added to the metallic surface of the substrate to form a reaction product of thermally grown oxide (TGO) of alumina between the bond coat and the TBC topcoat. As superalloy technology advances, creep resistant higher refractory-containing superalloys become of interest; however, these alloys are prone to being incompatible with currently available bond coats. Secondary reaction zones (SRZs) typically form at the bond coat-superalloy interfaces in superalloy systems containing high amounts of rhenium and/or ruthenium and results in a loss of mechanical integrity of the material.

SUMMARY

The present disclosure is directed to a process for coating a part. The process broadly comprises the steps of: providing a chamber which is electrically connected as an anode; placing the part to be coated in the chamber; providing a cathode formed from a coating material to be deposited and platinum; and applying a current to the anode and the cathode to deposit the coating material and the platinum on the part.

The present disclosure is also directed to an apparatus for depositing a platinum modified coating on a part. The apparatus broadly comprises a chamber which is electrically connected as an anode and in which the part to be coated is placed, and a cathode formed from a material to deposited onto the part and platinum.

Other details of the platinum modified cathodic arc coating process, as well as objects and advantages attendant thereto, are set forth in the following detailed description and the accompanying drawing.

BRIEF DESCRIPTION OF THE DRAWINGS

The FIGURE is a schematic representation of a cathodic arc coating apparatus.

DETAILED DESCRIPTION OF THE PREFERRED EMBODIMENT(S)

The present disclosure relates to a process and apparatus for forming a platinum modified bond coat, such as a platinum-modified cathodic arc-deposited NiCoCrAlY bond coating. The total coating composition of Pt-NiCoCrAlY is deposited by cathodic arc technology. The process by which the platinum is incorporated into the bond coat may be done in either of two ways: (1) the coating cathode material from which the coating is produced and deposited on the parts may be cast with the required amount of platinum in the ingot alloy; or (2) a coating cathode may be modified by platinum-plating the outside of an ingot and diffusing the platinum into the ingot alloy via heat treatment. Depositing a platinum-modified bond coat structure by cathodic arc, rather than by pre-plating, post-plating, or both pre- and post-plating the substrate to be bond coated results in a unique and more uniform structure and composition (of platinum, in particular) throughout the bond coat.

By adding platinum to the bond coating (i.e. the aluminum-source), the rate of depletion of aluminum from the bond coat is reduced, thus, increasing the life of the bond coat in the engine environment. Additionally, the platinum at the bond coat-superalloy interface lowers the activity of the aluminum in the bond coat and likely helps prevent the formation of SRZ. Because platinum is known to be a relatively slow diffuser among superalloy-containing elements, the introduction of platinum into the superalloy-bond coat interface may act to slow interdiffusion of elements from the superalloy into the bond coat. This helps in two primary ways by preventing elements which are detrimental to the formation of a continuous oxidation barrier in the bond coat from reaching the bond coat-TGO interface. Additionally, it slows the diffusion of nickel from the bond coat-superalloy interface which may in turn leave behind refractory-rich cellular by products often observed during SRZ formation.

The FIGURE illustrates a coating apparatus for performing cathodic arc coating. The coating apparatus 10 has a chamber 12 which forms the anode. Within the chamber 12, there is a platter 14 on which one or more parts 16 to be coated, such as turbine engine components, are positioned. A stinger 18 extends into the chamber 12. The stinger 18 has attached to it a plurality of magnets 20 and a cathode 22.

The coating apparatus 10 may be run at 300-500 amps with a current being applied to the cathode 22 and to the chamber (anode) 12 from a power source 23 and with a bias being applied to the parts 16 of −10V to −100V using a power source 25. The power sources 23 and 25 may be any suitable power source(s) known in the art.

Within the chamber 10, there may be a pressure of 10-100 microns (0.1 to 1.0 Pa) of a carrier gas such as argon. During deposition, the parts 16 may reach a temperature in the range of 400 to 600 degrees Fahrenheit. Coating time is variable and depends on the thickness of the desired coating.

The cathode 22 may be formed from an ingot of the coating material to be deposited which either has platinum plated on it or platinum incorporated into it. The platinum may comprise from 1 to 100% of the material to be deposited onto the part(s) 16. A useful range for the platinum is from 4.0 to 60% by weight.

The coating ingot forming the cathode 22 may be cast containing platinum in the aforesaid amount. For example, the cast coating ingot forming the cathode 22 may be a platinum modified NiCoCrAlY material. The ingot may be cast so as to uniformly contain the platinum. Of course, the coating ingot may be cast without the platinum if desired.

The coating ingots may be cast by vacuum induction melting (VIM). The ingots may be cast at approximately 2750 to 3250 degrees Fahrenheit (superheated above alloy melting temperature) in a partial pressure of argon gas. The ingots may then be hot-isostatic pressed at approximately 2100 to 2300 degrees Fahrenheit.

Alternatively, the cast coating ingot without platinum may have its external surfaces plated with platinum. Where the platinum is plated onto the external surfaces of the ingot, it may be diffused inwardly. A unique functionality of the coating is that the platinum concentration may be graded from "high" to "low" or "zero" as the coating builds up from the substrate to the surface of the coating. In this way, platinum concentration would be greatest closes to the alloy and leanest at the coating surface with the environment or optionally deposited thermal barrier coating. Having platinum concentrated at the substrate-bond coat interface is beneficial in that it is a slowly diffusing species compared to other superalloy containing elements. Thus, the formation of deleterious phases such as secondary reaction zones (SRZ) may be slowed by the presence of platinum at this location.

The coating material ingot to be plated may be prepared via grit blasting, such as 240 grit at 20-60 psi for three to five minutes, and rinsed clean using acetone. The ingot may be electrically cleaned using an alkali solution for 3 minutes at 125 degrees Fahrenheit at about 0.25 amps in a stainless steel beaker. Platinum may be plated to a desired thickness via a suitable electrolytic plating process. The thickness may be calculated based on the surface area to be coated. To plate platinum on an ingot, the ingot may be immersed in a platinum plating solution containing from 17 to 40 grams/liter platinum concentration (nominal concentration being approximately 30 grams/liter). Amperage is variable depending on ingot size, but may be in the range of from 0.2 to 0.6 amps. The platinum containing solution may be maintained at a temperature of about 190 to 200 degrees Fahrenheit. A low temperature heat treatment, such as approximately 350 to 400 degrees Fahrenheit for 2.5 to 4.0 hours, immediately follows the plating to out-gas any byproduct gasses from the plating process. An additional heat treatment may be performed at a high temperature, such as approximately 1900 to 2000 degrees Fahrenheit for 3.5 to 5.0 hours, to diffuse the platinum into the coated material in order to allow the platinum to infiltrate the substrate material in the region of interest where the arc will run in the cathodic arc process.

Cathodic arc coatings generally form dense, adherent coatings with uniform compositions from homogeneous composition cathode materials. For example, if the platinum is uniformly distributed in the cathode materials, the coating will contain a uniform compositional distribution of platinum.

The process described herein may be used to fabricate bond coatings for thermal barrier coating systems. These bond coats may be used to provide oxidation protection for the underlying substrate material.

While the ingot has been described as being formed from a NiCoCrAlY material, it should be recognized that the ingot may be formed from other materials, such as a MCrAlY material where M is selected from the group consisting typically of nickel, iron, or cobalt.

While the process and apparatus have been described as being used to form a bond coat, it should be recognized that they could be used to form other types of coatings.

It is apparent that there has been provided a description of a platinum modified cathodic arc coating process and apparatus. While the process has been described in the context of specific embodiments thereof, other unforeseeable alternatives, modifications, and variations may become apparent to those skilled in the art having read the foregoing description. Accordingly, it is intended to embrace those alternatives, modifications, and variations as fall within the broad scope of the appended claims.

What is claimed is:

1. A process for coating a turbine engine component comprising the steps of:
    providing a chamber which is electrically connected solely as an anode;
    placing said turbine engine component to be coated in said chamber;
    providing a cathode formed from a first MCrAlY material to be deposited where M is selected from the group consisting of nickel, iron, and cobalt, and from a second material which is from 4.0 to 60 wt% platinum, said providing step including casting an ingot of said first MCrAlY material and electrically connecting said cast ingot as said cathode;
    applying a current in the range of from 300 to 500 amps from a first power supply to said anode and said cathode and applying a bias to the turbine engine component of −10V to −100V using a second power source to deposit said MCrAlY material and said second material on said turbine engine component;
    wherein said process comprises electrolytically plating at least one surface of said cast ingot with said second material prior to applying said current, wherein plating includes grading said platinum with a concentration greatest closest to the at least one surface and leanest away from said at least one surface; and
    wherein a heat treatment of the cast ingot is performed at a temperature in the range of from 1900 degrees Fahrenheit to 2000 degrees Fahrenheit for 3.5 to 5.0 hours to diffuse the platinum into the MCrAlY material.

2. The process according to claim 1, wherein said electrolytic plating step comprises immersing said ingot into a platinum plating solution containing from 17 to 40 grams/liter platinum concentration and applying a current in the range of from 0.2 to 0.6 amps.

3. The process according to claim 2, further comprising maintaining said platinum plating solution at a temperature in the range of from 190 to 200 degrees Fahrenheit.

4. The process according to claim 1, further comprising outgassing any byproduct gases.

5. The process according to claim 4, wherein said outgassing step comprises applying heat at a temperature in the range of from 350 to 400 degrees Fahrenheit for a time in the range of from 2.5 to 4.0 hours.

6. An apparatus for depositing a platinum modified coating on a turbine engine component comprising:
    a chamber which is electrically connected solely as an anode and in which the turbine engine component to be coated is placed; and
    a cathode formed from a cast ingot of an MCrAlY material to be deposited onto said turbine engine component where M is a material selected from the group consisting of nickel, iron and cobalt, wherein said cast ingot of said material to be deposited has an electroplated platinum on at least one surface, said electroplated platinum having a graded concentration of platinum greatest closest to the at least one surface and leanest away from the at least one surface;
    a current in the range of from 300 to 500 amps being applied to the cathode and to the chamber from a first power source to deposit a coating onto said turbine engine component;
    a bias in the range of from −10V to −100V being applied to said turbine engine component from a second power source during coating of said turbine engine component.

7. An apparatus according to claim 6, further comprising a carrier gas at a pressure in the range of 10-20 microns within the chamber.

8. An apparatus according to claim 7, wherein said carrier gas is argon.

* * * * *